United States Patent
Liao et al.

(10) Patent No.: US 6,881,502 B2
(45) Date of Patent: *Apr. 19, 2005

(54) BLUE ORGANIC ELECTROLUMINESCENT DEVICES HAVING A NON-HOLE-BLOCKING LAYER

(75) Inventors: Liang-Sheng Liao, Rochester, NY (US); Kevin P. Klubek, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/669,451

(22) Filed: Sep. 24, 2003

(65) Prior Publication Data

US 2005/0064235 A1 Mar. 24, 2005

(51) Int. Cl.[7] ............................................... H05B 33/12
(52) U.S. Cl. ...................... 428/690; 428/917; 313/504; 313/506
(58) Field of Search ................................ 428/690, 917; 313/504, 506

(56) References Cited

U.S. PATENT DOCUMENTS

| | | | |
|---|---|---|---|
| 4,769,292 A | | 9/1988 | Tang et al. |
| 6,224,966 B1 | * | 5/2001 | Sakai et al. .................. 428/212 |
| 6,565,993 B1 | | 5/2003 | Toguchi et al. |
| 6,566,807 B1 | | 5/2003 | Fujita et al. |
| 2002/0197511 A1 | * | 12/2002 | D'Andrade et al. ........ 428/690 |
| 2003/0077480 A1 | | 4/2003 | Hosokawa et al. |
| 2003/0143427 A1 | * | 7/2003 | Matsuo et al. .............. 428/690 |
| 2004/0072017 A1 | * | 4/2004 | Nii et al. ..................... 428/690 |

FOREIGN PATENT DOCUMENTS

JP WO 02/079343 A1 * 10/2002

OTHER PUBLICATIONS

Shi et al, Antracene derivatives for stable blue–emitting organic electroluminescent devices, Appl. Phy. Lett. vol. 60, No. 17, Apr. 29, 2002, pp. 3201–3202.
Tang et al, Electroluminescent of doped organic thin films, J. Appl. Phys. 65 (9) May 1, 1989, pp. 3610–3616.
Adachi et al, Electroluminescence in Organic Films with Three Layer Structure, Japanese Journal of Applied Physics, vol. 27, No. 2, Feb. 1988, pp. L269–L271.
Tang et al, Organic electroluminescent diodes, Appl. Phys. Lett. 51 (12) Sep. 21, 1987, pp. 913–915.

* cited by examiner

*Primary Examiner*—Dawn Garrett
(74) *Attorney, Agent, or Firm*—Raymond L. Owens

(57) ABSTRACT

An organic electroluminescent device includes an anode; a hole-transporting layer disposed over the anode; a light-emitting layer disposed over the hole-transporting layer for producing blue light in response to hole-electron recombination, wherein the light emitting layer includes at least one host material and at least one dopant material; a non-hole-blocking buffer layer formed in contact with the light-emitting layer, wherein the non-hole-blocking buffer layer has substantially the same ionization potential and the same electron affinity as those of one of the host materials in the light-emitting layer; an electron-transporting layer disposed over the non-hole-blocking buffer layer; and a cathode disposed over the electron-transporting layer.

14 Claims, 7 Drawing Sheets

BLUE ORGANIC ELECTROLUMINESCENT DEVICES HAVING A NON-HOLE-BLOCKING LAYER

FIELD OF INVENTION

The present invention relates to improving the performance of an organic electroluminescent (EL) device. More specifically this invention relates to improving the performance of a blue EL device.

BACKGROUND OF THE INVENTION

Organic electroluminescent (EL) devices or organic light-emitting devices (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. demonstrated highly efficient OLEDs using such a layer structure in "Organic Electroluminescent Diodes", *Applied Physics Letters*, 51, 913 (1987) and in commonly assigned U.S. Pat. No. 4,769,292. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of Doped Organic Thin Films", *Journal of Applied Physics*, 65, 3610 (1989). The LEL commonly consists of a host material doped with a guest material. These three-layer structures are denoted as HTL/LEL/ETL. Further, there are other multi-layer OLEDs that contain additional functional layers, such as a hole-injecting layer (HIL), and/or an electron-injecting layer (EIL), and/or an electron-blocking layer (EBL), and/or a hole-blocking layer (HBL) in the devices. At the same time, many different types of EL materials are also synthesized and used in OLEDs. These new structures and new materials have further resulted in improved device performance.

In a full color OLED display, there are at least three primary colors of emission, i.e. red, green, and blue emission. Currently, red and green OLEDs have better performance than blue OLEDs. It is difficult to achieve both high luminous efficiency and good operational lifetime in the blue OLED. Therefore, improving the performance of the blue OLED will have a large impact on the applications of a full color OLED display. There are several ways to improve the blue OLED performance through material selection, device structure modification, etc. For examples, Shi et al. in "Anthracene Derivatives for Stable Blue-Emitting Organic Electroluminescence Devices", *Applied Physics Letters*, 80, 3201 (2002), and Hosokawa et al. in U.S. Patent Application 2003/0077480 A1, both achieved improved operational stability of blue emission by selecting proper materials. Other new methods for the improvement of the blue OLED performance are certainly necessary.

A conventional blue OLED, such as that using 2-(1,1-dimethyethyl)-9,10-bis(2-naphthalenyl) anthracene (TBADN) doped with 2,5,8,11-tetra-t-butylperylene (TBP), denoted as TBADN:TBP, as a LEL is shown in FIG. 1A, wherein OLED 100 includes an anode 120, a HTL 132, a LEL 134, an ETL 138, and a cathode 140. This device is externally connected to a voltage/current source 150 through electrical conductors 160. FIG. 1B shows a corresponding energy band diagram of the OLED 100 in FIG. 1A (in a flat band condition). The dotted lines in LEL 134 are the electron energy levels of the dopant material. In FIG. 1B, the ionization potential of ETL 138 (Ip(ETL)) is equal to or less than that of the LEL 134 (Ip(LEL)), and the electron energy band gap of ETL 138 (Eg(ETL)) is narrower than that of the emissive dopant material (Eg(dopant)) in LEL 134. This is the case when tris(8-hydroxyquinoline) aluminum (Alq) is used as the ETL 138. Since the Eg(ETL) is narrower than the Eg(dopant) in this case, some excitons formed in LEL 134 can diffuse into ETL 138 to produce green emission from the ETL 138 causing impure color emission from the device. In addition, since there is no energy barrier to hinder holes moving into the ETL 138 at the interface of LEL/ETL, the hole-electron recombination rate in the LEL 134 is relatively low resulting in low luminous efficiency.

The aforementioned electron energy band gap (Eg) is the energy difference between the ionization potential (Ip) and the electron affinity (Ea) of the film, or the energy difference between the highest occupied molecular orbital (HOMO) and the lowest unoccupied molecular orbital (LUMO) of the film. Practically, the Eg of organic thin films can be adopted using an optical energy band gap of the films, and the Ea of organic films can be calculated by subtracting the Eg from the Ip of the films. The Ip of organic thin films can be measured using an ultraviolet photoelectron spectroscopy, and the Eg of organic films can be measured using a UV-Vis absorption spectrometer.

FIG. 1C shows another corresponding energy band diagram of the OLED in FIG. 1A, wherein Ip(ETL) of ETL 138 is greater than Ip(LEL) and Eg(ETL) is equal to or a wider than Eg(dopant). This is the case when a wide band gap material, such as 4,7-diphenyl-1,10-phenanthroline (Bphen) or 2,9-dimethyl4,7-diphenyl-1,10-phenanthroline (BCP), is used as the ETL 138. In this case, pure blue emission may be achieved. However, we found that although the energy barrier at the interface of LEL/ETL can hinder holes moving into the ETL 138 and increase the luminous efficiency, the accumulated holes and electrons at this interface will shorten the operational lifetime. In order to obtain pure color emission, Toguchi et al. in U.S. Pat. No. 6,565,993 B2 inserted an intermediate layer, IML, between the LEL and the ETL satisfying the relation of Ip(LEL)<Ip(IML)<Ip (ETL). Although there were no lifetime data demonstrated in the patent, we believe that the energy barrier existing at the interface of LEL/IML can reduce the lifetime.

In some cases, for example, as disclosed by Fujita et al. in U.S. Pat. No. 6,566,807 B1, an HBL with both an ionization potential (Ip(HBL)) greater than Ip(LEL) and an electron energy band gap(Eg(HBL)) greater than Eg(dopant) can be inserted between the LEL and the ETL to prevent holes from escaping to the ETL and to increase the hole-electron recombination rate (if lp(HBL)=Ip(LEL), it is unlikely that there would be a noticeable hole-blocking effect). Such a device structure is shown in FIG. 2A, wherein OLED 200 has one more layer, i.e. HBL 236, than OLED 100 in FIG. 1A. According to the energy band diagram shown in FIG. 2B, holes can be accumulated at the interface of LEL/HBL to increase the luminous efficiency. In this case, excitons that form in the LEL and then diffuse into the HBL will not cause impure color emission in the HBL, regardless if the Ip(ETL) is less than, equal to, or greater than Ip(LEL). However, similar to OLED 100 having an energy band diagram of FIG. 1C, the blue OLEDs with a hole-blocking layer also have a shortened operational lifetime.

SUMMARY OF THE INVENTION

It is therefore an object of the present invention to improve the performance of a blue OLED.

It is another object of the present invention to improve the overall performance of a full color OLED display.

These objects are achieved by an organic electroluminescent device comprising:

a) an anode;

b) a hole-transporting layer disposed over the anode;

c) a light-emitting layer disposed over the hole-transporting layer for producing blue light in response to hole-electron recombination, wherein the light emitting layer includes at least one host material and at least one dopant material;

d) a non-hole-blocking buffer layer formed in contact with the light-emitting layer, wherein the non-hole-blocking buffer layer has substantially the same ionization potential and the same electron affinity as those of one of the host materials in the light-emitting layer;

e) an electron-transporting layer disposed over the non-hole-blocking buffer layer; and f) a cathode disposed over the electron-transporting layer.

The present invention makes use of a non-hole-blocking buffer layer (NHBL), where the non-hole-blocking buffer layer has substantially the same ionization potential and the same electron affinity as those of one of the host materials in the light-emitting layer. By this arrangement, a blue OLED can have lower drive voltage, higher luminous efficiency, and improved chromaticity compared to conventional blue OLEDs without compromising the operational stability.

Since device feature dimensions such as layer thicknesses are frequently in sub-micrometer ranges, the drawings of FIGS. 1A to 3C are scaled for ease of visualization rather than dimensional accuracy.

DETAILED DESCRIPTION OF THE INVENTION

Figure 3A:
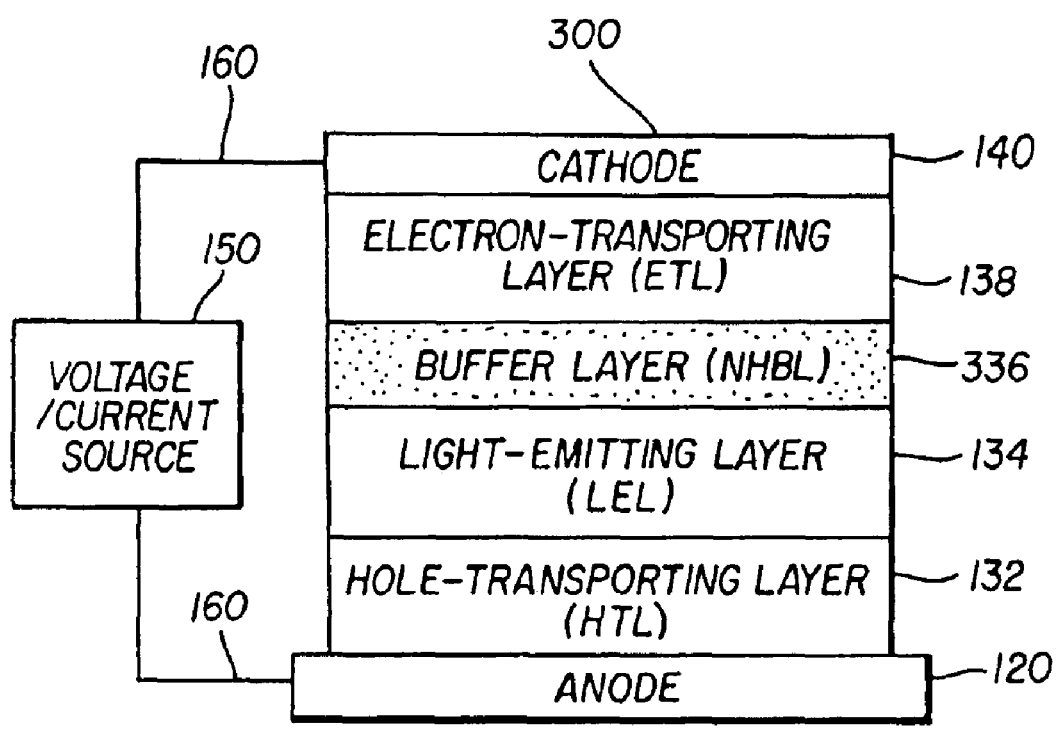
FIG. 3A shows a cross-sectional view of the present invention having a non-hole-blocking buffer layer.

As aforementioned, there are numerous OLEDs known in the art with alternative layer structures. The present invention is applicable to any blue OLED containing a non-hole blocking layer (NHBL) 336 as a buffer layer in contact with a LEL on the cathode side. FIG. 3A shows an OLED 300 in accordance with the present invention. OLED 300 has an anode 120 and a cathode 140, at least one of which is transparent. Disposed between the anode and the cathode are at least a HTL 132, a LEL 134, an NHBL 336, and an ETL 138. This device is externally connected to a voltage/current source 150 through electrical conductors 160.

Figure 1A:
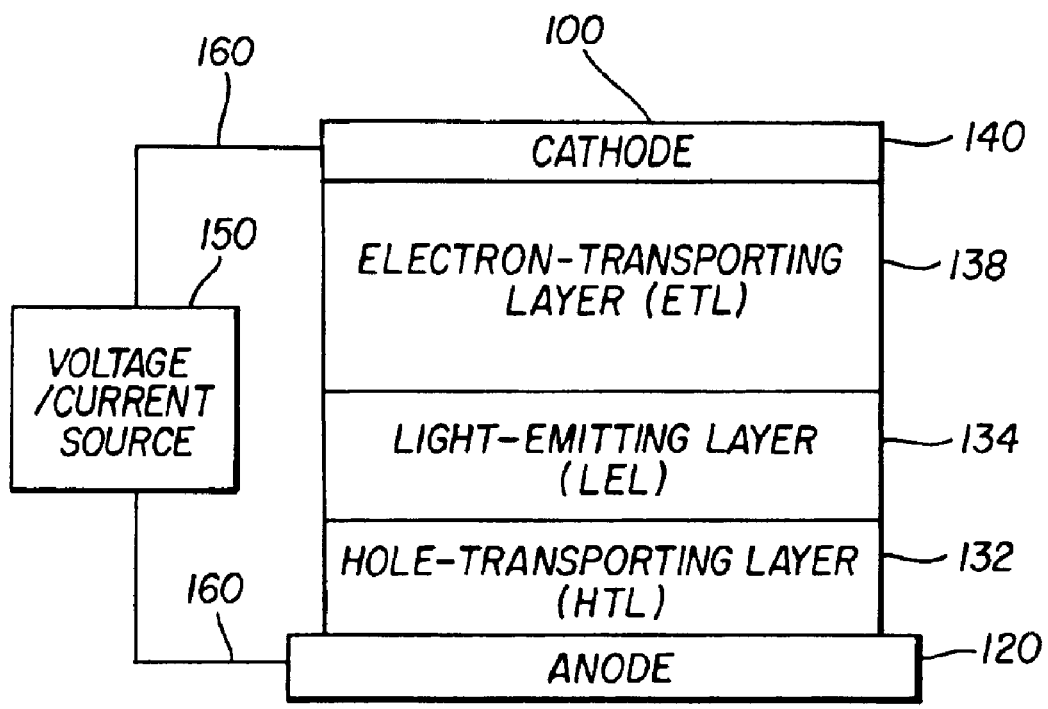
FIG. 1A shows a cross-sectional view of a prior art OLED.
Figure 1B:
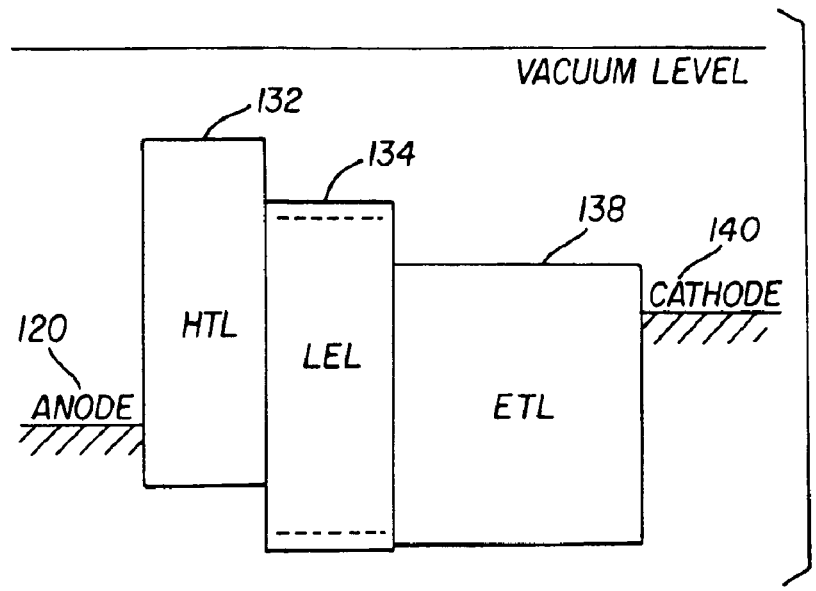
FIG. 1B shows a corresponding energy band diagram of the prior art OLED in FIG. 1A.
Figure 1C:
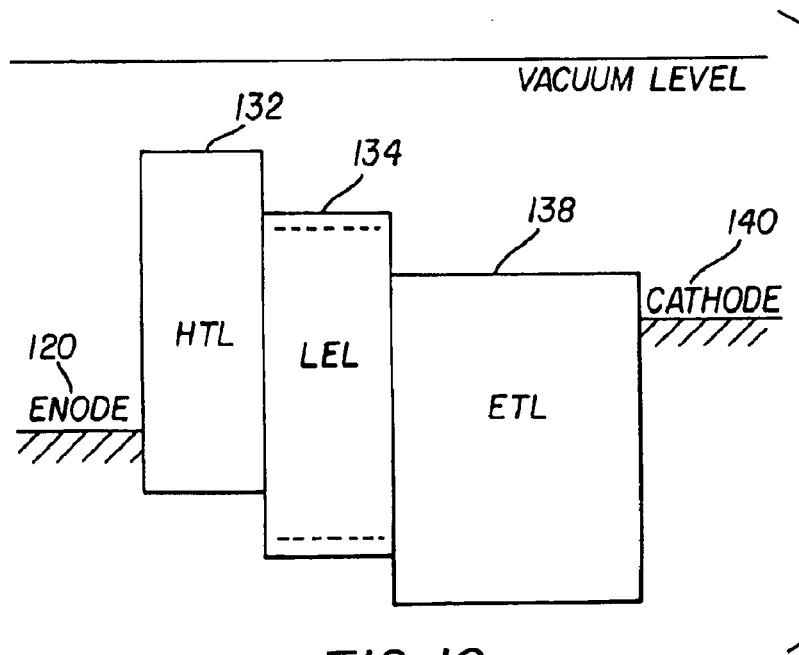
FIG. 1C shows another corresponding energy band diagram of the prior art OLED in FIG. 1A.
Figure 2A:
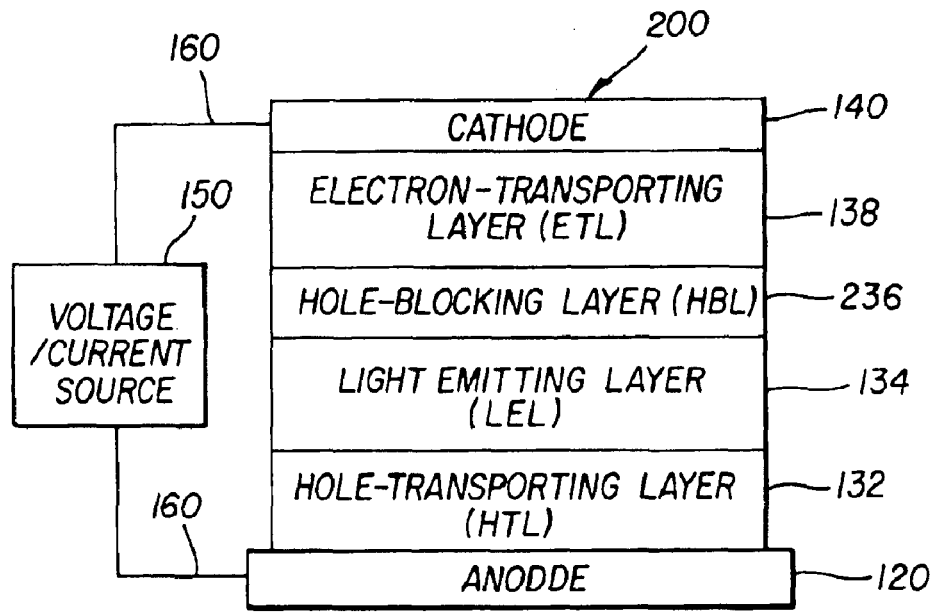
FIG. 2A shows a cross-sectional view of another prior art OLED having a hole-blocking layer.
Figure 2B:
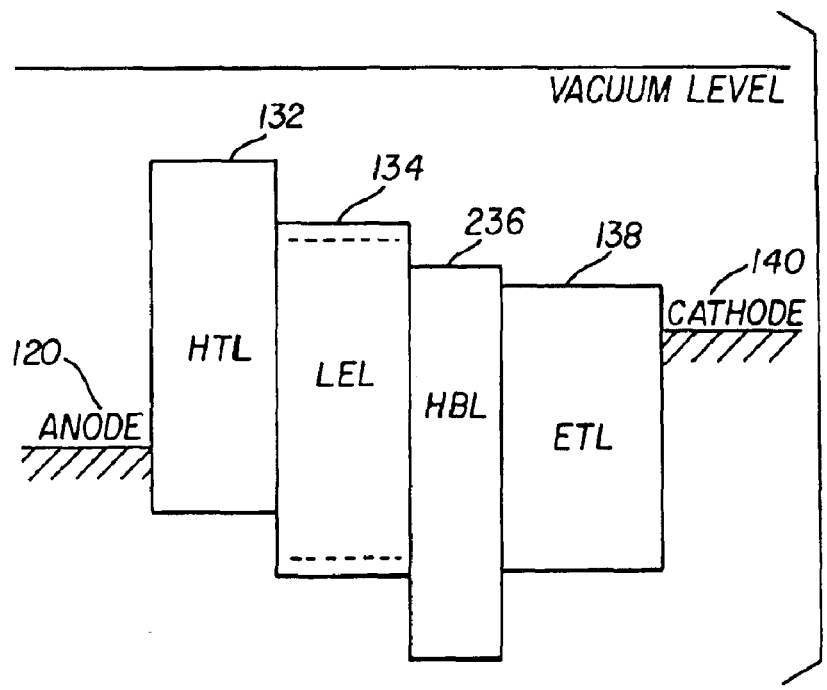
FIG. 2B shows a corresponding energy band diagram of the prior art OLED in FIG. 2A.

It is known from FIG. 1B that if an ETL 138 has a lower electron energy band gap than that of the dopant materials in a LEL 134, the emission of the OLED 300 cannot be a pure blue color. Therefore, in order to achieve pure blue emission without any emissive contribution from the ETL 138, the absolute value of the electron affinity of the ETL (Ea(ETL)) should be less than that of the dopant material(s) (Ea(dopant)) and the absolute value of the ionization potential of the ETL (Ip(ETL)) should be greater than that of the dopant material(s) (Ip(dopant)). We also found that an OLED 300 having a wide band gap ETL 138 as shown in FIG. 1C or having an HBL 236 as shown in FIG. 2B creates energy barriers not only for holes but also for electrons at the interface of LEL/ETL or LEL/ETL. As a result, the interface will be easily damaged due to a high electrical field across the one or two monolayers' region. Therefore, in order to prevent deterioration of the operational lifetime, the Ea(HBL) should be equal to or smaller than the Ea(host), and the Ip(HBL) should be equal to or smaller than the Ip(LEL).

In considering the above factors, the NHBL 336 is used in the present invention with its Ea(NHBL) and its Ip(NHBL) satisfying the condition of: 1) Ea(NHBL)≦Ea(host) and 2) Ip(dopant)<Ip(NHBL)<lp(host). However, if Ea(NHBL) is too small, it will create a great barrier for electron injection at the interface of NHBL/ETL. Therefore, Ea(NHBL) should be approximately equal to Ea(host). Since the difference between Ip(dopant) and Ip(host) is usually small, IP(NHBL) could be approximately equal to Ip(host). If there is more than one host material in the LEL, Ea(NHBL) could be approximately equal to any of the Ea(host), and Ip(NHBL) could be approximately equal to any of the Ip(host) as long as Eg(NHBL) is greater than any Eg(dopant) in the LEL 134.

Figure 3B:
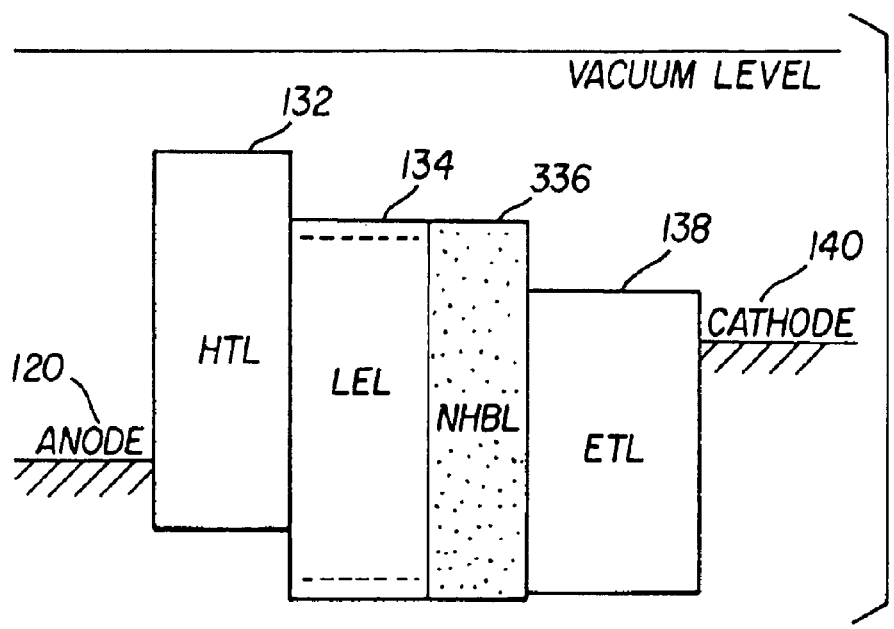
FIG. 3B shows a corresponding energy band diagram of the present invention in FIG. 3A.
Figure 3C:
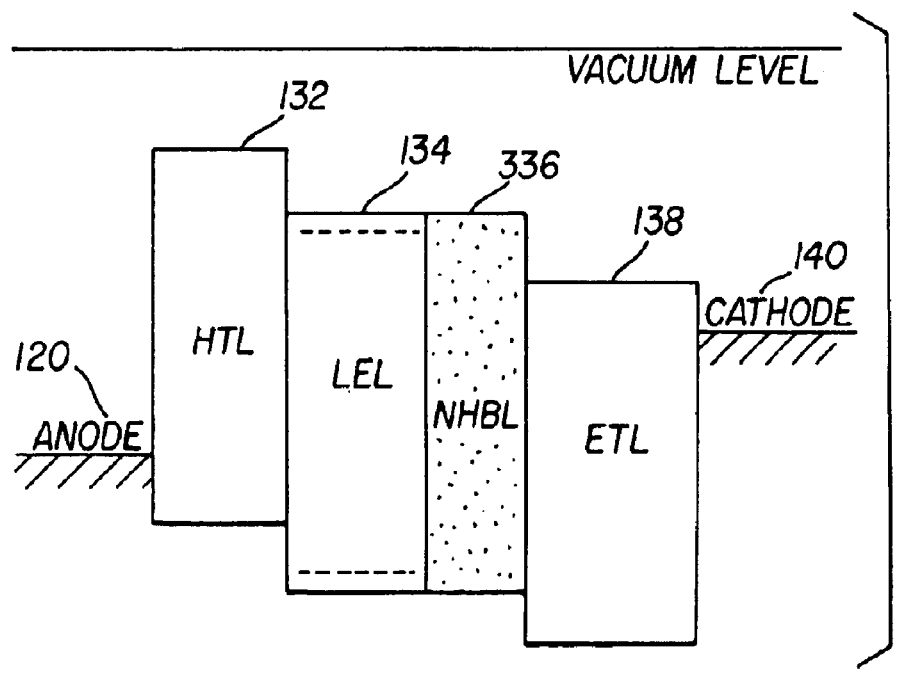
FIG. 3C shows another corresponding energy band diagram of the present invention in FIG. 3A.

Shown in FIG. 3B is the case wherein Ip(ETL) of ETL 138 is equal to or less than Ip(LEL) and Eg(ETL) is narrower than Eg(dopant) in LEL 134. We deposit NHBL 336 in contact with LEL 134. Unlike ETL 138 in FIGS. 1B and 1C, and HBL 236 in FIG. 2B, this NHBL 336 in FIG. 3B has essentially the same Ea and Ip as those of the host material in LEL 134. The electron energy band gap Eg(NHBL) of NHBL 336 is greater than 2.9 eV. This energy band structure can eliminate unwanted emission from ETL 138. Excitons formed at the interface of LEL/NHBL are not able to diffuse into ETL 138 if the thickness of NHBL 336 is greater than the exciton diffusion length which is usually less than 5 nm. Excitons that diffuse into NHBL 336 will emit their own photons if there is no low energy band gap impurity in NHBL 336. In the present invention, the thickness range of NHBL 336 is from 5 nm to 30 nm, preferably, from 5 nm to 20 nm. Moreover, since it does not block holes and electrons at the interface of LEL/NHBL, the damage at the interface of LEL/NHBL can be reduced. Shown in FIG. 3C is the case wherein lp(ETL) is greater than Ip(LEL) and Eg(ETL) is wider than Eg(dopant). In this case, even when the thickness of NHBL 336 is less than the exciton diffusion length, pure color emission may still be achieved, and the damage at the interface of LEL/NHBL can be reduced as well.

The material used in NHBL 336 can be an electron-transporting material or a hole-transporting material as long as it can meet the aforementioned energy band specifications. Preferably, the material used in NHBL 336 is the same host material used in LEL 134. Useful NHBL materials include, but are not limited to, derivatives of anthracene, such as 2-(1,1-dimethyethyl)-9,10-bis(2-naphthalenyl) anthracene (TBADN), 9,10-di-(2-naphthyl)anthracene (ADN), and derivatives thereof as described in U.S. Pat. No. 5,935,721, distyrylarylene derivatives as described in U.S. Pat. No. 5,121,029, benzazole derivatives, for example, 2, 2', 2"-(1,3,5-phenylene)tris[1-phenyl-1H-benzimidazole], and blue emitting metal chelated oxinoid compounds, for example, Bis(2-methyl-8-quinolinolato)(4-phenylphenolato)aluminum (B-Alq).

The blue OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 120, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications here EL emission is viewed only through the cathode electrode, the transmissive characteristics of the anode are immaterial and any conductive material can be used, regardless if it is transparent, opaque or reflective. Example conductors for this application include, but are not limited to, gold, iridium, molybdenum, palladium, and platinum. Typical anode materials, transmissive or otherwise, have a work function higher than 4.0 eV. Desired anode materials are commonly deposited by any suitable means such as evaporation, sputtering, chemical vapor deposition, or electrochemical means. Anodes can be patterned using well known photolithographic processes. Optionally, anodes may be polished prior to the deposition of other layers to reduce surface roughness so as to minimize electrical shorts or enhance reflectivity.

While not always necessary, it is often useful to provide a hole-injecting layer (HIL) in contact with anode 120. The HIL can serve to improve the film formation property of subsequent organic layers and to facilitate injection of holes into the HTL reducing the driving voltage of the OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA(4,4',4"-tris[(3-ethylphenyl)phenylamino]triphenylamine). Alternative hole-injecting materials reportedly useful in organic EL devices are described in EP 0 891 121 A1 and EP 1 029 909 A1.

A p-type doped organic layer is also useful for the HIL as described in U.S. Pat. No. 6,423,429 B2. A p-type doped organic layer means that the layer is electrically conductive, and the charge carriers are primarily holes. The conductivity is provided by the formation of a charge-transfer complex as a result of electron transfer from the host material to the dopant material.

The HTL 132 in the OLED contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1, 1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolyl)amino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl) phenyl] amino}biphenyl
4,4'-Bis[N-phenyl-N-(2-pyrenyl)amino]biphenyl
2,6-Bis[N,N-di(2-naphthyl)amine]fluorene 1,5-Bis[N-(1-naphthyl)-N-phenylamino]naphthalene 4,4',4"-tris[(3-methylphenyl)phenylamino]triphenylamine.

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) in organic EL units includes a luminescent or fluorescent material where electroluminescence is produced as a result of hole-electron recombination in this region. In the present invention, LEL 134 includes at least one host material doped with at least one dopant material where light emission comes primarily from the dopant and can be of blue color. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes, are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the triplet energy level of the host be high enough to enable energy transfer from host to dopant. Since this is a blue OLED, the electron energy band gap of both the host material and the dopant material in LEL 134 is greater than 2.9 eV which assures that the emission wavelength from the LEL 134 is shorter than 490 nm. The thickness of the LEL 134 could have a wide range, but preferably, it ranges from 5 nm to 30 nm.

Useful host materials include, but are not limited to, derivatives of anthracene, such as 2-(1,1-dimethylethyl)9,10-bis(2-naphthalenyl) anthracene (TBADN), 9,10-di-(2-naphthyl) anthracene (ADN), and derivatives thereof as described in U.S. Pat. No. 5,935,721, distyrylarylene derivatives as described in U.S. Pat. No. 5,121,029, benzazole derivatives, for example, 2, 2', 2"-(1,3,5-phenylene)tris[1-phenyl-1 H-benzimidazole], and blue emitting metal chelated oxinoid compounds, for example, Bis(2-methyl-8-quinolinolato)(4-phenylphenolato)aluminum (B-Alq). Carbazole derivatives are particularly useful hosts for phosphorescent emitters. Useful fluorescent dopants include, but are not limited to, derivatives of anthracene, tetracene, xanthene, perylene, thiopyran compounds, polymethine compounds, fluorene derivatives, bis(azinyl)amine boron compounds, bis(azinyl)methane compounds, and carbostyryl compounds.

Preferred thin film-forming materials for use in forming the electron-transporting layer (ETL) in the OLED of the present invention are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo(f)-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, and some silole derivatives are also useful electron-transporting materials.

An n-type doped organic layer is also useful for the ETL as described in U.S. Pat. No. 6,013,384. An n-type doped organic layer means that the layer is electrically conductive, and the charge carriers are primarily electrons. The conductivity is provided by the formation of a charge-transfer complex as a result of electron transfer from the dopant material to the host material.

When light emission is viewed solely through the anode, the cathode 140 used in the present invention can include nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers including a thin inorganic EIL in contact with an organic layer (e.g., ETL), which is capped with a thicker layer of a conductive metal. Here, the inorganic EIL preferably includes a low work-function metal or metal salt, and if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368. Cathode materials are typically deposited by thermal evaporation, electron-beam evaporation, ion sputtering, or chemical vapor deposition. When needed, patterning can be achieved through many well known methods including, but not limited to, through-mask deposition, integral shadow masking, for example as described in U.S.

Pat. No. 5,276,380 and EP 0 732 868, laser ablation, and selective chemical vapor deposition.

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. For full color display, the pixelation of LELs may be needed. This pixelated deposition of LELs can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

The entire contents of the patents and other publications referred to in this specification are incorporated herein by reference.

EXAMPLES

The present invention and its advantages can be better appreciated by the following inventive and comparative examples. For purposes of brevity, the materials and layers formed therefrom will be abbreviated as given below.

ITO: indium-tin-oxide; used in forming the transparent anode on glass substrates.
CFx: polymerized fluorocarbon layer; used in forming a hole-injecting layer on top of ITO.
NPB: N,N'-di(naphthalene-1-yl)-N,N'-diphenyl-benzidine; used in forming the hole-transporting layer.
TBADN: 2-(1,1-dimethyethyl)-9,10-bis(2-naphthalenyl) anthracene; used as the host material in forming the light-emitting layer.
TBP: 2,5,8,11-tetra-t-butylperylene; used as the dopant material in the light-emitting layer.
Alq: tris(8-hydroxyquinoline)aluminum(III); used in forming the electron-transporting layer.
Bphen: 4,7-diphenyl-1, 10-phenanthroline; used in forming the hole-blocking layer or in forming the electron-transporting layer.
TPBI: 1,3,5-Tris(N-phenylbenzimidazol-2-yl)benzene; used in forming the hole-blocking layer or in forming the electron-transporting layer.
B-Alq: Bis(2-methyl-8-quinolinolato)(4-phenylphenolato) aluminum; used in forming the non-hole-blocking buffer layer.
Li: Lithium; used as n-type dopant in forming the n-type doped electron-transporting layer.
Mg:Ag: magnesium:silver at a ratio of 10:0.5 by volume; used in forming the cathode.

In the following examples, the thickness of the organic layers and the doping concentrations were controlled and measured in situ using calibrated thickness monitors (INFICON IC/5 Deposition Controller). The electroluminescence characteristics of all the fabricated devices were evaluated using a constant current source (KEITHLEY 2400 SourceMeter) and a photometer (PHOTO RESEARCH SpectraScan PR 650) at room temperature. The color will be reported using Commission Internationale de l'Eclairage (CIE) coordinates. Ionization potential (Ip) of organic thin films was measured using an ultraviolet photoelectron spectroscopy in a photoelectron spectroscopy system (VG THERMAL ESCALAB-250). Optical energy band gap (~Eg) of organic thin films were measured using a UV-Vis absorption spectrometer (HP 8453 UV-Vis Spectrometer). During the operational lifetime test, the devices being tested were driven at a current density of 20 mA/cm$^2$ in a 70° C. oven (VWR Scientific Products).

Example 1

Conventional OLED—Comparative

The preparation of a conventional blue OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 mm thick, was deposited on the clean ITO surface as the HIL by decomposing CHF$_3$ gas in an RF plasma treatment chamber. The substrate was then transferred into a vacuum deposition chamber (TROVATO MFG. INC) for deposition of all other layers on top of the substrate. The following layers were deposited in the following sequence by evaporation from a heated boat under a vacuum of approximately 10$^{-6}$ Torr:

(1) a HTL, 90 nm thick, consisting of NPB;
(2) a LEL, 20 nm thick, consisting of TBADN host material doped with 1.5 vol. % TBP;
(3) an ETL, 35 nm thick, consisting of Alq; and
(4) a cathode, approximately 210 nm thick, consisting of Mg:Ag.

After the deposition of these layers, the device was transferred from the deposition chamber into a dry box (VAC Vacuum Atmosphere Company) for encapsulation. The completed device structure is denoted as ITO/CFx/NPB (90)/TBADN:TBP(20)/Alq(35)/Mg:Ag. Since Ip(TBADN)=5.8 eV, Eg(TBP)>3.0 eV, Ip(Alq)=5.8 eV, and Eg(Alq)=2.7 eV, this device structure has the same electron energy diagram as that shown in FIG. 1B.

Figure 4:
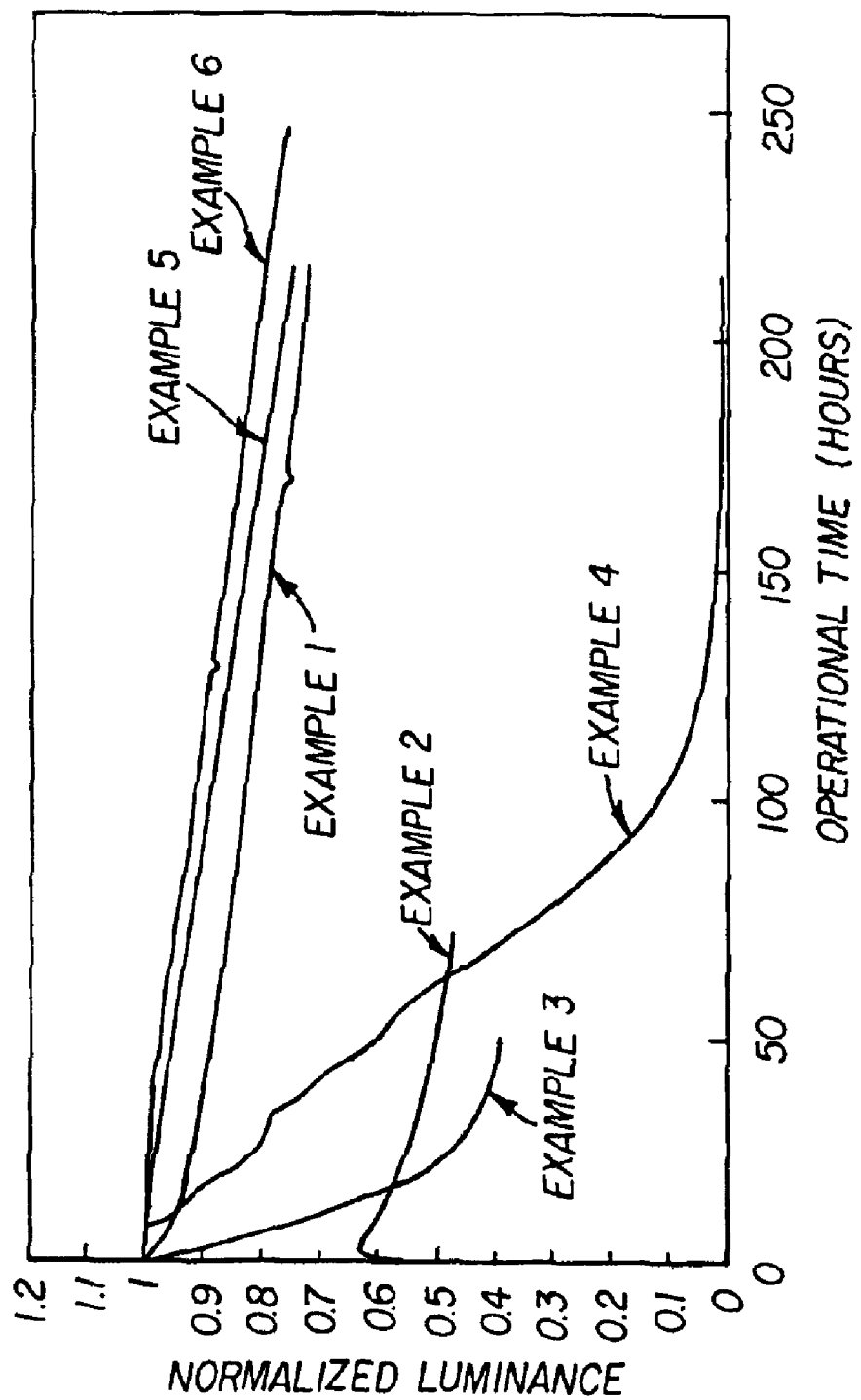
FIG. 4 shows the operational lifetime of the OLEDs fabricated according to the present invention as well as the prior art.
Figure 5:
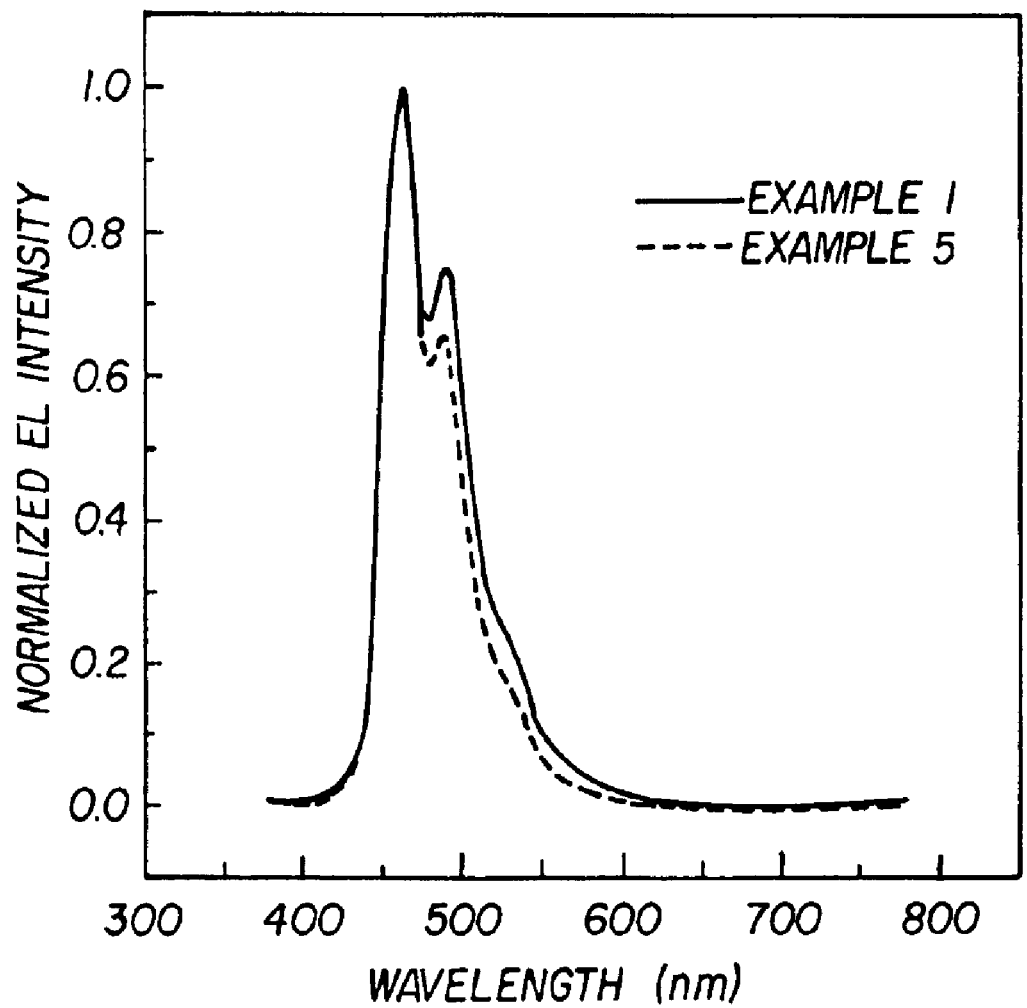
FIG. 5 shows the EL spectra of both prior art and OLEDs fabricated according to the present invention.

When measured at a current density of 20 mA/cm$^2$, the device has a drive voltage of 7 V, luminance of 567 cd/m$^2$, luminous efficiency of 2.83 cd/A, CIEx,y of 0.144, 0.214, and radiance of 2.99 W/Sr/m$^2$. The operational time at which the initial luminance has dropped by 20% (denoted as T$_{80}$(70° C.)) is about 130 hours. The normalized luminance vs. operational time is shown in FIG. 4, and the EL spectrum is shown in FIG. 5.

Example 2

Comparative Example

A blue OLED was constructed in the manner described in Example 1, except in Step 3, the 35 nm Alq ETL is replaced by a 35 nm Bphen ETL. Since Ip(TBADN)=5.8 eV, Eg(TBP)>3.0 eV, Ip(Bphen)=6.5 eV, and Eg(Bphen)=3.4 eV, this device structure has the same electron energy diagram as that shown in FIG. 1C.

When measured at a current density of 20 mA/cm$^2$, the device has a drive voltage of 7.2 V, luminance of 667 cd/m$^2$, luminous efficiency of 3.34 cd/A, CIEx,y of 0.137, 0.192, and radiance of 3.84 W/Sr/m$^2$. Although the luminous efficiency, radiance, and the color purity of this device are much better than those of Example 1, the operational lifetime of the device is very short because its $T_{80}(70°$ C.)) is less than 30 min. The normalized luminance vs. operational time is shown in FIG. 4.

Example 3

Comparative Example

A blue OLED was constructed in the manner described in Example 1, except in Step 3, the 35 nm Alq ETL is replaced by a 35 nm TPBI ETL. Since Ip(TBADN)=5.8 eV, Eg(TBP) >3.0 eV, Ip(TPBI)=6.2 eV, and Eg(TPBI)=3.4 eV, this device structure has the same electron energy diagram as that shown in FIG. 1C.

When measured at a current density of 20 mA/cm$^2$, the device has a drive voltage of 7.4 V, luminance of 622 cd/M$^2$, luminous efficiency of 3.11 cd/A, CIEx,y of 0.139, 0.210, and radiance of 3.35 W/Sr/m$^2$. Although the luminous efficiency, radiance, and the color purity of this device are better than those of Example 1, the operational lifetime of the device is short because its $T_{80}(70°$ C.)) is about 8 hours The normalized luminance vs. operational time is shown in FIG. 4.

Example 4

Comparative Example

A blue OLED was constructed in the manner described in Example 1, except in Step 3, the 35 nm Alq ETL is replaced by a 10 nm Bphen as a HBL plus a 25 nm n-type doped ETL comprising Bphen doped with 1.2 vol. % Li. Since Ip(TBADN)=5.8 eV, Eg(TBP)>3.0 eV, Ip(Bphen)=6.5 eV, and Eg(Bphen)=3.4 eV, this device structure has the same electron energy diagram as that shown in FIG. 2B.

When measured at a current density of 20 mA/cm$^2$, the device has a drive voltage of 5.1 V, luminance of 633 cd/m$^2$, luminous efficiency of 3.17 cd/A, CIEx,y of 0.135, 0.187, and radiance of 3.73 W/Sr/m$^2$. This device has pure color emission and high luminous efficiency. However, similar to Examples 2 and 3, the operational lifetime of the device is short because its $T_{80}(70°$ C.)) is about 26 hours. The normalized luminance vs. operational time is shown in FIG. 4.

Example 5

Inventive Example

A blue OLED was constructed in the manner described in Example 1, except in Step 3, the 35 nm Alq ETL is replaced by a 5 run B-Alq as a non-hole-blocking buffer layer plus a 30 nm n-type doped ETL comprising Alq doped with 1.2 vol % Li. Since Ip(TBADN)=5.8 eV, Ea(TBADN)=2.6 eV, Ip(B-Alq)=5.8 eV, Ea(B-Alq)=2.6 eV, Ip(Alq)=5.8 eV and Ea(Alq)=3.1 eV, this device structure has the same electron energy diagram as that shown in FIG. 3B.

When measured at a current density of 20 mA/cm$^2$, the device has a drive voltage of 5.9 V, luminance of 619 cd/m$^2$, luminous efficiency of 3.09 cd/A, CIEx,y of 0.134, 0.177, radiance of 3.80 W/Sr/m$^2$, and $T_{80}(70°$ C.)) of 172 hours. The normalized luminance vs. operational time is shown in FIG. 4 and the EL spectrum is shown in FIG. 5. Compared to the conventional device (Example 1), the EL performance of the device has been improved.

Example 6

Inventive Example

A blue OLED was constructed in the manner described in Example 1, except in Step 3, the 35 nm Alq ETL is replaced by a 10 nm TBADN as a non-hole-blocking buffer layer plus a 25 nm n-type doped ETL comprising Bphen doped with 1.2 vol % Li. Since Ip(TBADN)=5.8 eV, Ea(TBADN)=2.6 eV, Ip(Bphen)=6.5 eV, and Ea(Bphen)=3.1 eV, this device structure has the same electron energy diagram as that shown in FIG. 3C.

When measured at a current density of 20 mA/cm$^2$, the device has a drive voltage of 5.3 V, luminance of 594 cd/M$^2$, luminous efficiency of 2.97 cd/A, CIEx,y of 0.135, 0.167, radiance of 3.82 W/Sr/m$^2$, and $T_{80}(70°$ C.)) of 210 hours. The normalized luminance vs. operational time is shown in FIG. 4. Compared to the conventional device (Example 1), the EL performance of the device has been improved.

Shown in Table 1 is the summary of the EL performance of the examples discussed above.

TABLE 1

| Example (Type) (EL measured at 20 mA/cm$^2$) | Voltage (V) | Luminance (cd/m$^2$) | Luminous Efficiency (cd/A) | CIE x (1931) | CIE y (1931) | Radiance (W/Sr/m$^2$) | $T_{80}$ (70° C.) (Hrs) |
|---|---|---|---|---|---|---|---|
| 1 (Inventive) | 7.02 | 567 | 2.83 | 0.144 | 0.214 | 2.984 | 130 |
| 2 (Comparative) | 7.22 | 667 | 3.34 | 0.137 | 0.192 | 3.841 | <0.5 |
| 3 (Comparative) | 7.37 | 662 | 3.11 | 0.139 | 0.210 | 3.347 | 8 |
| 4 (Comparative) | 5.13 | 633 | 3.17 | 0.135 | 0.187 | 3.732 | 26 |
| 5 (Inventive) | 5.9 | 619 | 3.09 | 0.134 | 0.177 | 3.801 | 172 |
| 6 (Inventive) | 5.28 | 594 | 2.97 | 0.135 | 0.167 | 3.815 | 210 |

The invention has been described in detail with particular reference to certain preferred embodiments thereof, but it will be understood that variations and modifications can be effected within the spirit and scope of the invention.

PARTS LIST

100 OLED (prior art)
200 OLED having a hole-blocking layer (prior art)
300 OLED (present invention)
120 Anode
132 Hole-transporting layer, HTL
134 Light-emitting layer, LEL 138 Electron-transporting layer, ETL
140 Cathode
236 Hole-blocking layer, HBL
336 Non-hole-blocking buffer layer, NHBL

What is claimed is:

1. An organic blue light-emitting electroluminescent device comprising:

a) an anode;
   b) a hole-transporting layer disposed over the anode;
   c) a light-emitting layer disposed over the hole-transporting layer for producing blue light in response to hole-electron recombination, wherein the light emitting layer includes at least one host material and at least one dopant material;
   d) an undoped non-hole-blocking buffer layer formed in contact with the light-emitting layer, wherein the non-hole-blocking buffer layer has the same ionization potential and the same electron affinity as those of one of the host materials in the light-emitting layer;
   e) an electron-transporting layer disposed over the non-hole-blocking buffer layer; and
   f) a cathode disposed over the electron-transporting layer.

2. The organic blue light-emitting electroluminescent device of claim 1 wherein the electron energy band gap of the host material in the light-emitting layer is higher than 2.9 eV.

3. The organic electroluminescent device of claim 1 wherein the emission wavelength from the light-emitting layer is shorter than 490 nm.

4. The organic blue light-emitting electroluminescent device of claim 1 wherein the electron energy band gap of the non-hole-blocking buffer layer is higher than 2.9 eV.

5. The organic blue light-emitting electroluminescent device of claim 1 wherein the thickness range of the light-emitting layer is from 5 nin to 30 nm.

6. The organic blue light-emitting electroluminescent device of claim 1 wherein the thickness range of the non-hole-blocking buffer layer is from 5 nm to 30 nm.

7. The organic blue light-emitting electroluminescent device of claim 1 wherein the thickness range of the non-hole-blocking buffer layer is from 5 nm to 20 nm.

8. The organic blue light-emitting electroluminescent device of claim 1 wherein the host material in the light-emitting layer includes anthracene derivatives.

9. The organic blue light-emitting electroluminescent device of claim 8 wherein the anthracene derivatives include 2-(1,1-dimethyethyl)-9,10-bis(2-naphthalenyl) anthracene (TBADN) and 9,10-di-(2-naphthyl) anthracene (ADN).

10. The organic blue light-emitting electroluminescent device of claim 1 wherein the non-hole-blocking buffer layer is the same material as one of the host materials in the light-emitting layer.

11. The organic blue light-emitting electroluminescent device of claim 1 wherein the non-hole-blocking buffer layer includes a material selected from anthracene derivatives.

12. The organic blue light-emitting electroluminescent device of claim 11 wherein the anthracene derivatives include 2-(1,1-dimethyethyl)-9, 10-bis(2-naphthalenyl) anthracene (TBADN) and 9,10-di-(2-naphthyl) anthracene (ADN).

13. The organic blue light-emitting electroluminescent device of claim 1 wherein the non-hole-blocking buffer layer includes a material selected from blue emitting metal chelated oxinoid compounds.

14. The organic blue light-emitting electroluminescent device of claim 13 wherein the blue emitting metal chelated oxinoid compounds include Bis(2-methyl-8-quinolinolato)(4-phenylphenolato)aluminum (B-Alq).

* * * * *